US009599496B2

(12) United States Patent
Asano et al.

(10) Patent No.: US 9,599,496 B2
(45) Date of Patent: Mar. 21, 2017

(54) FLOW RATE MEASURING DEVICE WITH FIRST TEMPERATURE SENSOR IN A MAIN PASSAGE AND SECOND TEMPERATURE SENSOR IN A SUB-PASSAGE

(75) Inventors: Satoshi Asano, Tokyo (JP); Masahiro Matsumoto, Tokyo (JP); Hiroshi Nakano, Tokyo (JP); Keiji Hanzawa, Hitachinaka (JP); Ryosuke Doi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 187 days.

(21) Appl. No.: 14/369,285

(22) PCT Filed: Jan. 10, 2012

(86) PCT No.: PCT/JP2012/000067
§ 371 (c)(1),
(2), (4) Date: Jun. 27, 2014

(87) PCT Pub. No.: WO2013/105124
PCT Pub. Date: Jul. 18, 2013

(65) Prior Publication Data
US 2014/0360262 A1    Dec. 11, 2014

(51) Int. Cl.
*G01F 1/684* (2006.01)
*G01F 1/69* (2006.01)
(Continued)

(52) U.S. Cl.
CPC ............ *G01F 1/684* (2013.01); *G01F 1/6842* (2013.01); *G01F 1/6845* (2013.01); *G01F 1/69* (2013.01);
(Continued)

(58) Field of Classification Search
CPC ............ G01F 1/68; G01F 1/684; G01F 1/6845
See application file for complete search history.

(56) References Cited

U.S. PATENT DOCUMENTS

| 2003/0101809 A1 | 6/2003 | Matsumura et al. |
| 2006/0112763 A1 | 6/2006 | Uramachi et al. |

(Continued)

FOREIGN PATENT DOCUMENTS

| JP | 2003-166865 A | 6/2003 | |
| JP | EP 1365216 | * 11/2003 | ............ G01F 1/6845 |

(Continued)

OTHER PUBLICATIONS

Corresponding International Search Report dated Mar. 6, 2012, with English Translation (two (2) pages).

*Primary Examiner* — Daniel J Colilla
(74) *Attorney, Agent, or Firm* — Crowell & Moring LLP (57) ABSTRACT

A flow rate measuring device with high precision is provided.
The flow rate measuring device includes a sub-passage that takes a part of the fluid flowing in a main passage, first temperature measuring means for measuring a temperature of the fluid flowing in the passage, second temperature measuring means for measuring a temperature of a fluid flowing in the sub-passage, detecting means for detecting a flow rate of the fluid flowing in the sub-passage, and measuring means for measuring a flow rate of the fluid flowing within the main channel on the basis of an output of the first temperature measuring means, an output of the second temperature measuring means, and an output of the detecting means.

16 Claims, 9 Drawing Sheets

(51) Int. Cl.
*G01F 1/696* (2006.01)
*G01F 5/00* (2006.01)
*G01F 15/02* (2006.01)

(52) U.S. Cl.
CPC ................ *G01F 1/696* (2013.01); *G01F 5/00* (2013.01); *G01F 15/02* (2013.01)

(56) References Cited

U.S. PATENT DOCUMENTS

| | | | |
|---|---|---|---|
| 2007/0195857 A1* | 8/2007 | Krishnamurthy | G01K 1/16 374/148 |
| 2009/0000366 A1 | 1/2009 | Uramachi | |
| 2011/0023597 A1* | 2/2011 | Nakano | G01F 1/6845 73/204.25 |
| 2011/0140211 A1* | 6/2011 | Kono | G01F 1/684 257/415 |
| 2011/0296904 A1* | 12/2011 | Tagawa | G01F 1/684 73/114.32 |

FOREIGN PATENT DOCUMENTS

| | | |
|---|---|---|
| JP | 2006-153694 A | 6/2006 |
| JP | 2009-8619 A | 1/2009 |
| JP | 2011209152 A * | 10/2011 |

* cited by examiner

FLOW RATE MEASURING DEVICE WITH FIRST TEMPERATURE SENSOR IN A MAIN PASSAGE AND SECOND TEMPERATURE SENSOR IN A SUB-PASSAGE

TECHNICAL FIELD

The present invention relates to a flow rate measuring device, and more particularly to a flow rate measuring device that is installed in an intake system of a vehicle engine, and suitable for detecting an intake air quantity.

BACKGROUND ART

In recent years, an advanced precision of a combustion control in an internal combustion engine of a vehicle has been demanded for a reduction in an environmental load of the vehicle, and in response to this demand, an advanced precision in the flow rate measuring device for measuring the intake air quantity into the vehicle is desirable. In particular, because an ambient temperature of the internal combustion engine for the vehicle largely fluctuates due to various factors, a measurement error reduction technique which is caused by a temperature is important in the flow rate measuring device frequently installed in the vicinity of the internal combustion engine.

For example, there has been experimentally known that a measurement error is caused by a temperature difference between the intake air and the flow rate measuring device when the temperature of the flow rate measuring device rises due to a heat generated from the internal combustion engine. As a related art for suppressing the measurement error, there are techniques disclosed in Patent Literature 1 and Patent Literature 2.

CITATION LIST

Patent Literature

Patent Literature 1: Japanese Unexamined Patent Application Publication No. 2006-153694
Patent Literature 2: Japanese Unexamined Patent Application Publication No. 2009-8619

Patent Literature 1 discloses a technique in which a circuit board and a flow rate detection element are arranged on a front surface side of a metal plate having a rear surface side exposed to a main passage so that a fluid temperature of the main passage is likely to be conducted to the flow rate detection element, and the flow rate detection element is also arranged apart from a main passage pipe wall to prevent a heat of the main passage pipe wall from being conducted to the flow rate detection element.

According to Patent literature 1, even if the temperature difference occurs between an interior and an exterior of the main passage, the temperature of the flow rate detection element is likely to follow the temperature of the fluid. That is, because it is difficult to generate a temperature difference between the flow rate detection element and the fluid, accurate flow rate detection can be realized.

Patent Literature 2 discloses a technique in which the circuit board and the flow rate detection element are arranged on a resin plate made of, for example, polybutylene terephthalate so that a heat of the main passage pipe wall and the circuit board is prevented from being conducted to the flow rate detection element.

According to Patent Literature 2, even if the temperature difference between the interior and the exterior of the main passage occurs, the thermal influence from the main passage pipe wall to the flow rate detection element can be suppressed because a thermal conductivity of the resin plate is small. That is, because it is difficult to generate the temperature difference between the flow rate detection element and the fluid, accurate flow rate detection can be realized.

According to the above-described techniques disclosed in Patent Literature 1 and Patent Literature 2, a structure in which the temperature of the flow rate detection element is brought closer to a suitable temperature such as a temperature of the fluid, to thereby reduce the measurement error caused by the temperature difference between the flow rate detection element and the fluid.

SUMMARY OF INVENTION

Technical Problem

However, as a result of study by inventors of the present application, it is found that the measurement error caused by the temperature difference between the intake air and the flow rate detection element, as well as the measurement error caused by the difference between the temperature of the fluid flowing within a main passage and the temperature of the fluid flowing within a sub-passage can occur.

The above conventional art does not consider the measurement error caused by the difference between the temperature of the fluid flowing within the main passage and the temperature of the fluid flowing within the sub-passage, and cannot suppress the measurement error.

OBJECT OF INVENTION

An object of the present invention is to provide a flow rate measuring device with high precision.

Solution to Problem

In order to achieve the above object, according to the present invention, there is provided a flow rate measuring device including: a sub-passage that takes a part of fluid flowing in a main passage; a first temperature sensor that measures a temperature of the fluid flowing in the main passage; and a second temperature sensor that is disposed within the sub-passage, and measures a temperature of a fluid different in temperature from the fluid flowing in the main passage.

Advantageous Effects of Invention

According to the present invention, there can be provided the flow rate measuring device with high precision.

DESCRIPTION OF EMBODIMENTS

Hereinafter, embodiments according to the present invention will be described with reference to the drawings.

A first embodiment will be described with reference to FIGS. 1 to 4.

Figure 1:
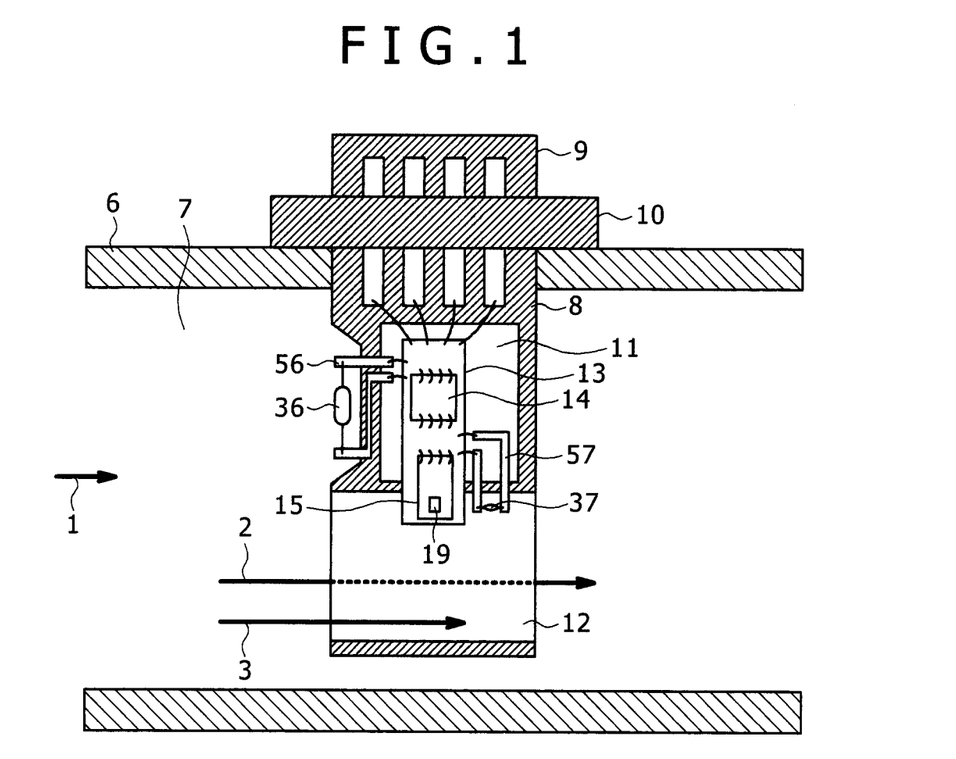
FIG. 1 is a configuration diagram of a flow rate measuring device according to a first embodiment.

As illustrated in FIG. 1, a flow rate measuring device according to a first embodiment is configured so that a casing 8, a substrate 13, a circuit element 14, a sensor element 15, a first temperature sensor 36, and a second temperature sensor 37 are disposed within a main passage 7 formed by a pipe 6 for supplying an intake air 1 to an internal combustion engine (not shown) of an automobile.

The casing 8 includes a connector portion 9 that is protruded to the external of the pipe 6, a flange portion 10 that fixes the casing 8 to the pipe 6, a circuit chamber 11, and a sub-passage 12 that takes a mainstream 2 flowing in the main passage 7, that is, a part of the intake air 1.

The sensor element 15 is formed of a semiconductor substrate made of Si or the like, and includes a thin diaphragm 19 formed by processing the semiconductor substrate. A heater resistor 24, a heater temperature monitor resistor 25 having a resistance value changed according to a temperature of the heater 24, a reference resistor 26, a reference resistor 27, and a reference resistor 28 each having a resistance value changed according to a temperature of a tributary 3 flowing in the sub-passage 12, an upstream temperature measuring resistor 31 and an upstream temperature measuring resistor 32 which are located upstream of the heater resistor 24 in a main flow direction of the tributary 3, and a downstream temperature measuring resistor 33 and a downstream temperature measuring resistor 34 which are located downstream of the heater resistor 24 in the main flow direction of the tributary 3, are formed in the diaphragm 19.

As a modified example of this embodiment, the reference resistor 26, the reference resistor 27, and the reference resistor 28 may be disposed outside of the diaphragm 19, and also on the sensor element 15. Also, a second diaphragm may be disposed on the sensor element 15 in addition to the diaphragm 19, and the reference resistor 26, the reference resistor 27, and the reference resistor 28 may be formed on the second diaphragm.

The substrate 13 supports the circuit element 14 and the sensor element 15, and the circuit element 14 and the sensor element 15 are electrically connected to each other through a bonding wire and the substrate 13. Also, a part of the substrate 13 is protruded into the sub-passage 12 so that the diaphragm 19 is exposed to the tributary 3.

The first temperature sensor 36 is arranged at a position exposed to the intake air 1 with the use of a support member 56 extended from the circuit chamber 11 to an exterior of the casing 8. Also, the support member 56 also functions as a connection medium that electrically connects the first temperature sensor 36 and the circuit element 14.

The second temperature sensor 37 is arranged at a position exposed to the tributary 3 with the use of a support member 57 extended from the circuit chamber 11 into the sub-passage 12. Also, the support member 57 functions as a connection medium that electrically connects the second temperature sensor 37 and the circuit element 14.

The flow rate measuring device according to the first embodiment conducts feedback control so that the heater resistor 24 is always higher than the tributary 3 by a given temperature in order to keep a flow rate measurement sensitivity constant (hereinafter this control is called "heater temperature control").

Figure 2:
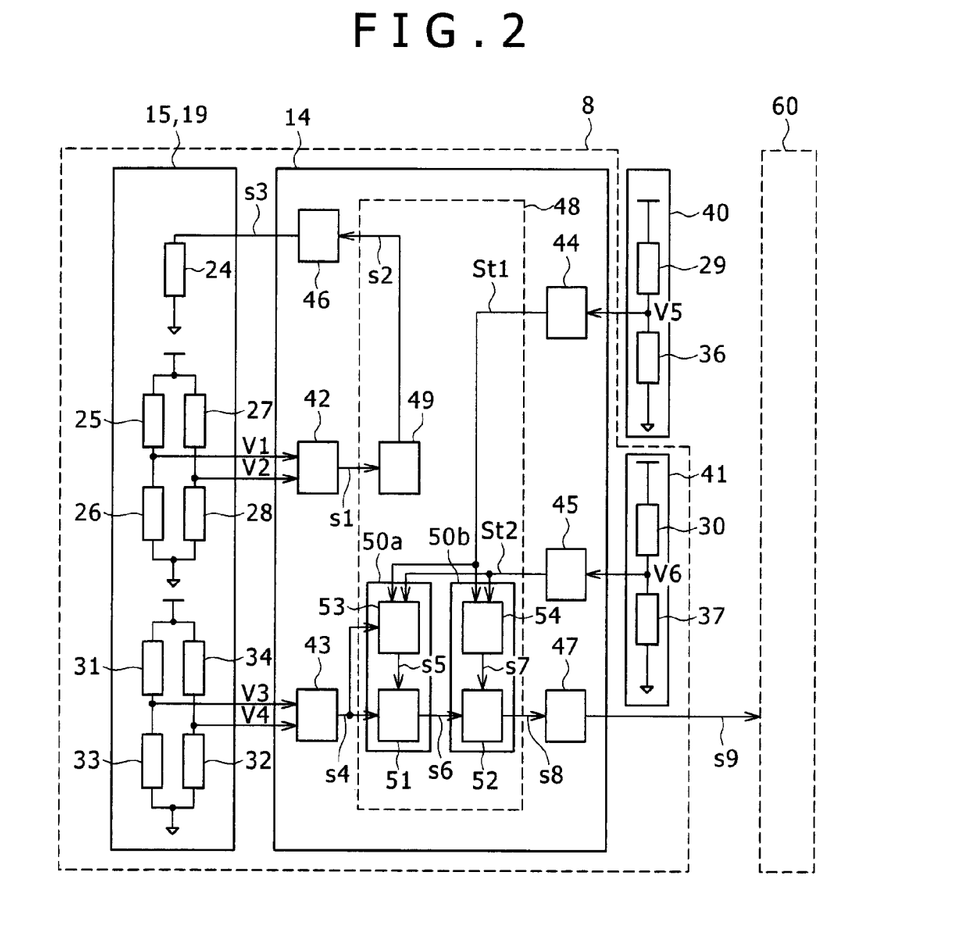
FIG. 2 is a circuit diagram of the flow rate measuring device according to the first embodiment.
Figure 3:
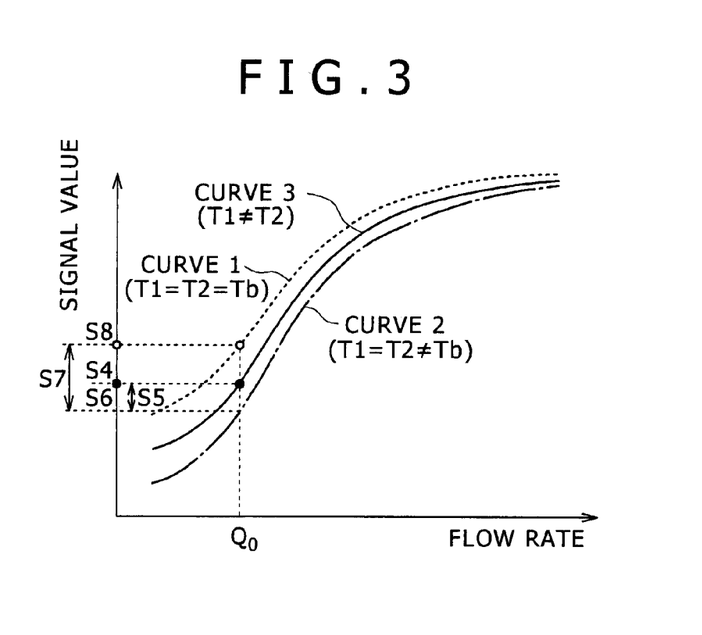
FIG. 3 is a schematic view of detection characteristics of the flow rate measuring device.

As illustrated in FIG. 2, means for detecting the temperature of the heater resistor 24 is configured by a bridge circuit including the heater temperature monitor resistor 25, the reference resistor 26, the reference resistor 27, and the reference resistor 28. Then, an intermediate potential V1 between the heater temperature monitor resistor 25 and the reference resistor 26, and an intermediate potential V2 between the reference resistor 27 and the reference resistor 28 are input to the circuit element 14. A difference voltage between V1 and V2 is converted into a digital signal s1 by an AD converter 42 mounted on the circuit element 14.

Subsequently, the digital signal s1 is input to a digital signal processor circuit 48 (hereinafter called DSP 48) mounted on the circuit element 14, and the DSP 48 executes a heater temperature control program 49 to output a heater temperature control signal s2. Subsequently, the heater temperature control signal s2 is converted into a heater drive signal s3 by a DA converter 46 mounted on the circuit element 14, and supplied to the heater resistor 24.

The heater temperature control program 49 controls the digital signal s1 to be zero. For that reason, when a device offset of the AD converter 42 is ignored, V1 and V2 have the same potential while the heater temperature control is executed.

In this example, when it is assumed that the temperature of the tributary 3 rises, for example, 3K, a change in the resistance value corresponding to a temperature rise of 3K occurs in the reference resistor 26, the reference resistor 27, and the reference resistor 28. In general, because a temperature change ratio of the respective resistance values of the reference resistor 26, the reference resistor 27, and the reference resistor 28 has the same degree, when the temperature of the heater resistor 24 is fixed, only V1 changes in the output of the bridge circuit at that time. Then, the heater temperature control program 49 changes the heater temperature control signal s2, that is, the heater drive signal s3 so that V1 and V2 become the same potential, and the temperature of the heater resistor 24 rises 3K.

The heater temperature control is realized by the above operation.

In order to measure the flow rate, a bridge circuit is configured by the upstream temperature measuring resistor 31, the upstream temperature measuring resistor 32, the downstream temperature measuring resistor 33, and the downstream temperature measuring resistor 34. Then, an intermediate potential V3 between the upstream temperature measuring resistor 31 and the downstream temperature measuring resistor 33, and an intermediate potential V4 between the upstream temperature measuring resistor 32 and the downstream temperature measuring resistor 34 are input to the circuit element 14. A difference voltage between V3 and V3 is converted into a digital signal s4 by an AD converter 43 mounted on the circuit element 14, and input to the DSP 48.

Also, in order to measure a temperature T1 of the intake air 1, a series resistor circuit 40 is configured by the first temperature sensor 36 and a fixed resistor 29. An intermediate potential V5 between the first temperature sensor 36 and the fixed resistor 29 is input to the circuit element 14, converted into a digital temperature signal St1 by an AD converter 44 mounted on the circuit element 14, and input to the DSP 48.

Further, in order to measure a temperature T2 of the tributary 3, a series resistor circuit 41 is configured by the second temperature sensor 37 and a fixed resistor 30. An intermediate potential V6 between the second temperature sensor 37 and the fixed resistor 30 is input to the circuit element 14, converted into a digital temperature signal St2 by an AD converter 45 mounted on the circuit element 14, and input to the DSP 48.

In this situation, when the temperature T1 of the intake air 1 and the temperature T2 of the tributary 3 have relationships of T1≠Tb, T2≠Tb, and T1≠T2 with respect to a reference temperature Tb, the digital signal s4 includes a measurement error (hereinafter called "temperature difference causing error") caused by a difference between T1 and T2, and a measurement error (hereinafter called "absolute temperature causing error") caused by a difference between T1 or T2, and Tb. The detection characteristic is, for example, curve 3 in FIG. 3.

The DSP 48 corrects the temperature difference causing error and the absolute temperature causing error described above to generate a flow rate signal s8. A detection characteristic of the flow rate signal s8 is, for example, Curve 1 in FIG. 3. A temperature difference causing error correction unit 50a is used for correction of the temperature difference causing error, and an absolute temperature causing error correction unit 50b is used for correction of the absolute temperature causing error.

The temperature difference causing error correction unit 50a derives a correction amount s5 for correcting the temperature difference causing error with the use of a correction amount derivation program 53. In this case, the derivation method may be derivation using arithmetic calculation, or may be derivation using a data map.

Subsequently, a correction program 51 corrects the digital signal s4 on the basis of the correction amount s5, and generates a correction signal s6 obtained by correcting the temperature difference causing error. The correction signal s6 is, for example, an output characteristic when both of temperatures of the intake air 1 and the tributary 3 are T2, and the detection characteristic of the correction signal s6 is, for example, a curve 2 in FIG. 3. The correction signal s6 includes the absolute temperature causing error caused by a difference between T2 and the reference temperature Tb.

Then, the correction signal s6 is input to the absolute temperature causing error correction unit 50b. The absolute temperature causing error correction unit 50b derives a correction amount s7 for correcting the absolute temperature causing error with the use of a correction amount derivation program 54. The correction amount s7 is an amount for canceling the absolute temperature causing error included in the correction signal s6.

Subsequently, a correction program 52 corrects the absolute temperature causing error on the basis of the correction amount s7 in the correction signal s6 to generate the flow rate signal s8.

With the above correcting operation described above, the flow rate signal s8 with excellent precision, including no measurement error caused by the differences of the temperature T1 of the intake air 1 and the temperature T2 of the tributary 3 from the reference temperature Tb can be produced.

Subsequently, the flow rate signal s8 is converted into an output signal s9 by a DA converter 47 mounted on the circuit element 14, and output from the connector portion 9 to an engine control unit 60 (hereinafter called "ECU 60") disposed outside of the pipe 6.

A signal transmission medium to the ECU 60 is not particularly limited. For example, a communication driver may be provided instead of the DA converter 47, and an output method using a digital communication as the transmission medium may be applied instead of the output method using an analog signal as the transmission medium. Also, a variable frequency oscillator may be disposed instead of the DA converter 47, and an output method using a frequency signal as the transmission medium may be applied. Further, a modulator may be provided instead of the DA converter 47, and an output method using a modulation signal as the transmission medium may be applied.

Subsequently, a basic principle for allowing the correction amount derivation program 53 to derive the correction amount s5 will be described.

The conventional flow rate measuring device disclosed in Patent Literature 1 and Patent Literature 2 takes a part of fluid flowing in a main passage into a sub-passage, detects a flow rate of fluid flowing in the sub-passage by a flow rate detection element disposed within the sub-passage, and estimates a flow rate of fluid flowing within the main passage on the basis of the detection result to realize a flow rate measuring function.

In order to realize this function, it is necessary that a ratio (hereinafter called "flow rate ratio") of the flow rate of fluid flowing in the main passage and the flow rate of fluid flowing in the sub-passage has been known. If the flow rate ratio is changed from the known value, because the flow rate within the main passage cannot be precisely estimated from the detection results of the flow rate detection element provided in the sub-passage, the measurement error is generated.

According to the study of the present inventors, it is found that the flow rate ratio depends on a temperature of fluid flowing in the main passage, and a temperature of fluid flowing in the sub-passage.

Hereinafter, a principle that the flow rate ratio depends on the fluid temperatures of the respective passages will be described.

A pipe a pipe friction loss ΔP of a flow channel is represented by Expression 1. λ is a pipe friction coefficient, L is a flow channel length, ρ is an air density, U is a flow rate, and d is a flow channel diameter.

[Ex. 1]

$$\Delta P = 0.5 \lambda L \rho U^2 / d \qquad \text{Ex. 1}$$

When it is assumed that the respective pipe friction losses of one flow channel (hereinafter called "flow channel 1") and the other channel (hereinafter called "flow channel 2") are ΔP1 and ΔP2 in a flow channel that is branched from one flow channel into two flow channels, and again joins together, ΔP1=ΔP2 is satisfied. A flow rate ratio Q1/Q2 of a mass flow rate Q1 that passes through the flow channel 1 and a mass flow rate Q2 passing through the flow channel 2 is obtained by a function represented by Expression 2. A pipe friction coefficient λ is a function of viscosity μ of air. Also, A, α, β, γ, and δ are constants depending on the flow rates.

[Ex. 2]

$$\frac{Q1}{Q2} \times A \sqrt{\left(\frac{L1}{L2}\right)^\alpha \left(\frac{r2}{r1}\right)^\beta \left(\frac{\rho 2}{\rho 1}\right)^\gamma \left(\frac{\mu 1}{\mu 2}\right)^\delta} \quad \text{Ex. 2}$$

According to Expression 2, the flow rate ratio of the fluids flowing in the flow channel 1 and the flow channel 2 are functions of the temperature and the flow rate. L1, L2, r1, and r2 are dimensional parameters of the respective flow channels, and have no temperature dependency and no flow rate dependency if linear expansions caused by a temperature change are ignored. On the other hand, the air density ρ and the air viscosity μ are temperature functions, and A, α, β, γ, and δ are constants depending on the flow rate. For that reason, the flow rate ratio is a function of the temperature and the flow rate.

That is, according to Expression 2, in order to derive the flow rate ratio, it would be obvious that there is a need to know the temperature of fluid flowing in the flow channel 1 and the temperature of fluid flowing in the flow channel 2, and the flow rates at that time, in addition to the shape dimensions of the flow channels.

The correction amount derivation program 53 derives the correction amount s5 based on s4, St1, and St2, on the basis of the above basic Expression 2. The deriving method when the correction amount derivation program 53 derives the correction amount s5 may be derivation using the arithmetic calculation, or derivation using the data map.

Subsequently, the effects by the flow rate measuring device according to the first embodiment will be described with reference to FIG. 4.

Figure 4:
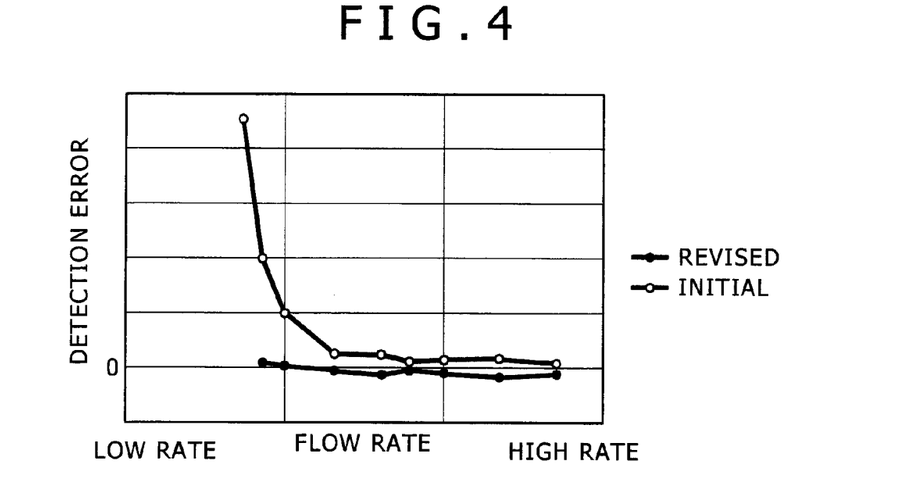
FIG. 4 is a comparative view of measurement errors.

It is found from FIG. 4 that the temperature difference causing error has a tendency to increase more as the flow rate is lower, and the correction effect by the technique of the present invention is significantly exercised. Also, the measurement error becomes substantially zero in a wide flow rate area with the correction made by the technique of the present invention.

From the above description, since the advantages of the flow rate measuring device according to the first embodiment measure an intake air flow rate on the basis of the temperature information on the first temperature sensor 36 and the second temperature sensor 37, the measurement error caused by the difference between the fluid temperature within the main passage 7 and the fluid temperature within the sub-passage 12 can be removed with high precision. As a result, a change in the flow rate ratio between the main passage 7 and the sub-passage 12 can suppress an influence on the output of the flow rate measuring device. In particular, since an influence of a heat from a wall surface of the sub-passage on the fluid flowing in the sub-channel becomes larger as the flow rate is lower, the measurement error caused by the difference between the fluid temperature within the main passage 7 and the fluid temperature within the sub-passage 12 becomes large. On the other hand, in the present invention, since the measurement error caused by the difference between the fluid temperature within the main passage 7 and the fluid temperature within the sub-passage 12 is reduced, the effects of the measurement error reduction become more remarkable as the flow rate is lower as compared with the conventional art. As a result, the lower flow rate area can be more accurately measured. Therefore, the flow rate measurement with higher precision than that of the conventional flow rate measuring device can be realized.

Figure 5:
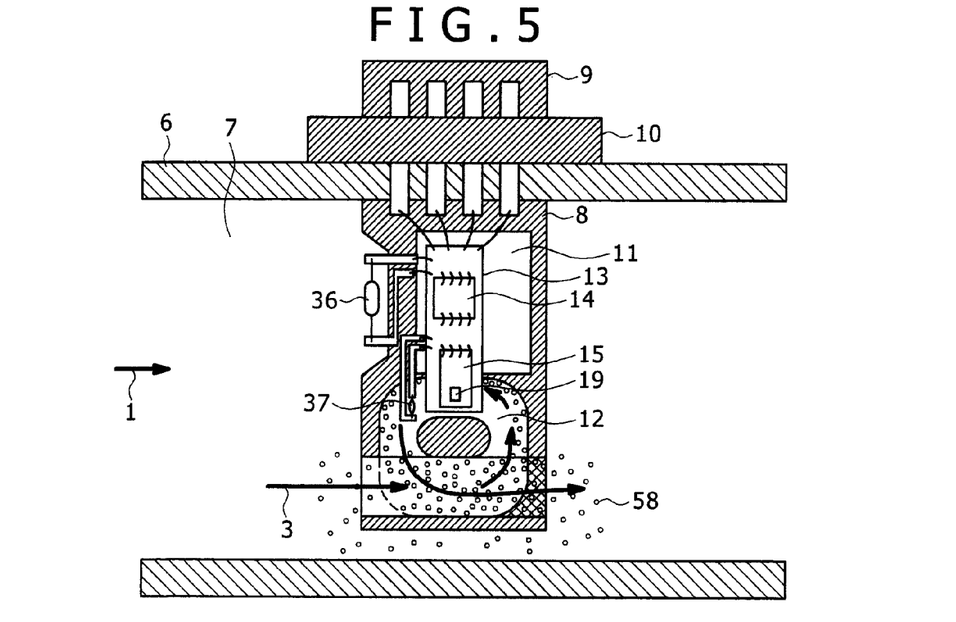
FIG. 5 is a configuration diagram of a flow rate measuring device according to a second embodiment.

Subsequently, a second embodiment according to the technique of the present invention will be described with reference to FIG. 5.

A flow rate measuring device according to the second embodiment is characterized in that the sub-passage 12 is bent within the casing 8, and attachment or collision of foreign matter 58 entering the sub-passage 12 to the diaphragm 19 is suppressed by a centrifugal effect obtained when a flow direction of the tributary 3 is changed according to a shape of the sub-passage 12. The configurations other than the sub-passage are identical with those in the first embodiment, and therefore a description thereof will be omitted.

The flow rate measuring device according to the second embodiment has an advantage that a defect incidence such as a characteristic change caused by a damage of the diaphragm 19 by the foreign matter 58, or the attachment of the foreign matter 58 can be suppressed by the above features in addition to the advantages of the first embodiment.

Figure 6:
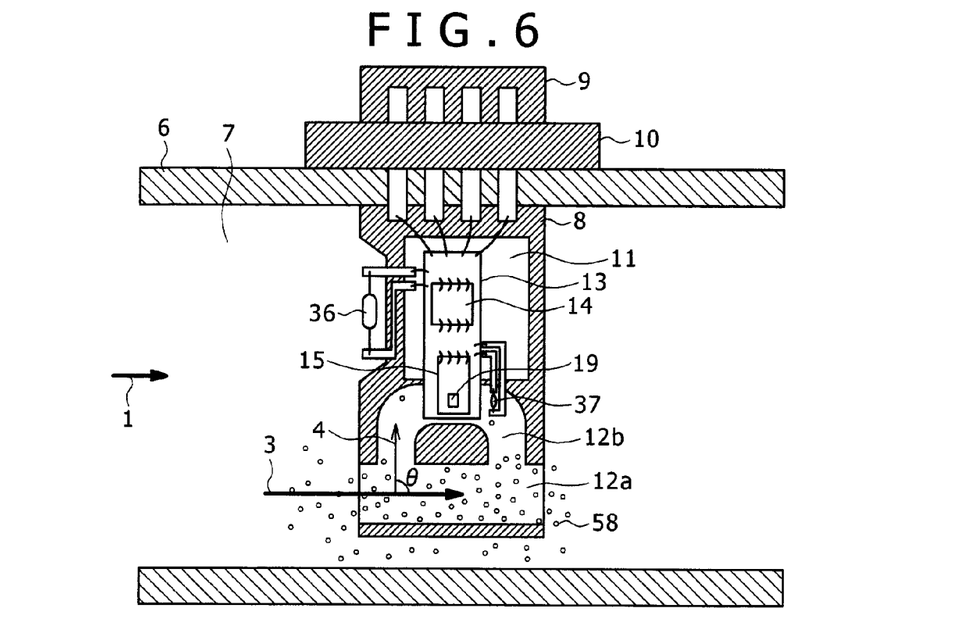
FIG. 6 is a configuration diagram of a flow rate measuring device according to a third embodiment.

Subsequently, a third embodiment according to the technique of the present invention will be described with reference to FIG. 6.

A flow rate measuring device according to the third embodiment includes a first sub-passage 12a having openings at both ends communicated with the main passage 7, and a second sub-passage 12b having openings at both ends communicated with the first sub-passage 12a. The openings of the second sub-passage 12b is inclined from a main flow direction of the tributary 3 flowing in the sub-passage 12a, and the diaphragm 19 is exposed to the fluid in the second sub-passage 12b. The configurations other than the sub-passage are identical with those in the first embodiment, and therefore a description thereof will be omitted.

According to the flow rate measuring device according to the third embodiment, a flow rate of a sub-tributary 4 which is obtained by further branching the tributary 3 flowing in the sub-passage 12a is measured to detect the flow rate of the intake air 1. Because the openings of the second sub-passage 12b is inclined from the main flow direction of the tributary 3 flowing in the sub-passage 12a, the foreign matter 58 that has entered the sub-passage 12a hardly enters the sub-passage 12b. For that reason, the amount of foreign matter 58 that passes through a periphery of the diaphragm 19 is smaller than the amount of foreign matter 58 that passes through the periphery of the diaphragm 19 in the flow rate measuring device according to the second embodiment. As a result, the defect incidence by the foreign matter 58 can be further suppressed.

Further, the flow rate measuring device according to the third embodiment is configured so that an angle θ formed between the main flow direction of the tributary 3 and the main flow direction of the sub-tributary 4 becomes 90 degrees or more. With the above configuration, the amount of foreign matter 58 entering the sub-passage 12b can be dramatically suppressed, and the defect incidence caused by the foreign matter 58 can be further suppressed.

As in the second embodiment and the third embodiment, when the diaphragm 19 is to be protected from dust, a shape of the sub-passage 12 is complicated. For that reason, when the diaphragm 19 is configured to be protected from dust, a difference between the temperature of the fluid flowing in the main passage 7 and the temperature of the fluid flowing in the sub-passage 12 becomes large, and the measurement error caused by this temperature difference becomes also large. With the configuration of the present invention, since the flow rate of the intake air 1 can be more precisely measured while the diaphragm 19 is protected from dust, the flow rate measuring device high in reliability can be provided.

In order to more accurately measure the temperature of the fluid flowing in the sub-channel, it is preferable that the second temperature sensor 37 is disposed in the vicinity of the sensor element 15. Further, it is preferable that the second temperature sensor 37 is disposed downstream of the sensor element in the flow of the fluid so that the sensor element 15 does not disturb the flow of the fluid which is measured by the sensor element 15.

Also, in the third embodiment, in order to more accurately measure the intake air quantity, it is preferable that the second temperature sensor is disposed in each of the first sub-passage 12a and the second sub-passage 12b, and the intake air flow rate is measured on the basis of the temperature information of the first temperature sensor 36 and the respective second temperature sensors 37 disposed in the first sub-passage 12a and the second sub-passage 12b.

Figure 7:
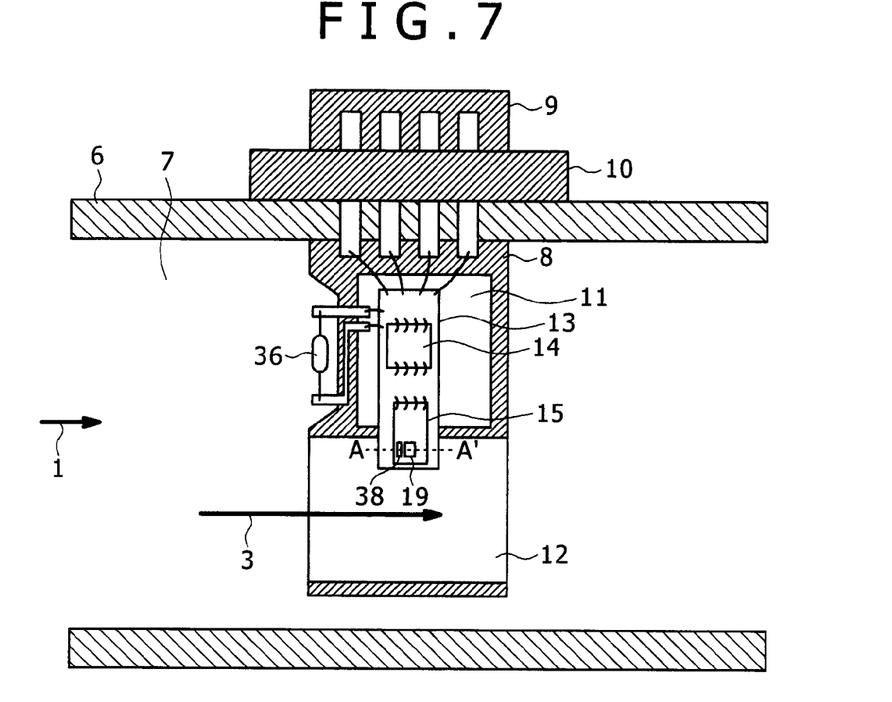
FIG. 7 is a configuration diagram of a flow rate measuring device according to a fourth embodiment.
Figure 8:
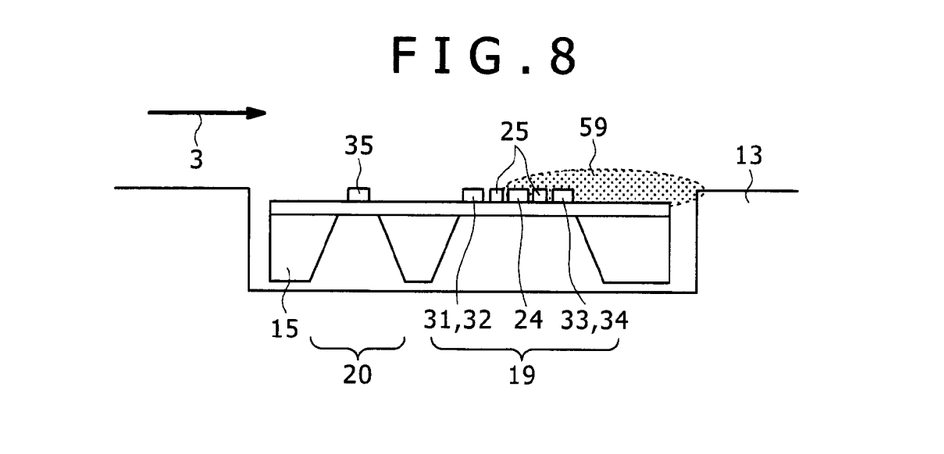
FIG. 8 is a cross-sectional view of the flow rate measuring device taken along a line A-A' according to the fourth embodiment.

Subsequently, a fourth embodiment according to the technique of the present invention will be described with reference to FIGS. 7 and 8.

A flow rate measuring device according to the fourth embodiment is characterized in that an on-chip temperature sensor 38 formed on the sensor element 15 is disposed instead of the second temperature sensor 37 in the flow rate measuring device according to the first embodiment. Also, the configurations other than the on-chip temperature sensor 38 are identical with those in the first embodiment, and therefore a description thereof will be omitted.

The on-chip temperature sensor 38 is, for example, a temperature sensor configured by forming a thin sub-diaphragm 20 on the sensor element 15 aside from the diaphragm 19, and forming a temperature measuring resistor 35 on the sub-diaphragm 20. The on-chip temperature sensor 38 is disposed upstream of the diaphragm 19 in the flow of the fluid.

This is because it is experientially known that a temperature of an area 59 downstream of the diaphragm 19 becomes higher than the temperature of the tributary 3 since a heat generated by the heater resistor 24 is diffused in a downstream direction due to the fluid of the tributary 3. Therefore, a position where the temperature measuring resistor 35 measures the temperature of the tributary 3 needs to be hardly affected by the heat generated by the heater resistor 24.

Also, in a configuration where the on-chip temperature sensor 38 is disposed on the sub-diaphragm 20, the diaphragm 19 and the sub-diaphragm 20 are formed on the same semiconductor substrate plane, and the on-chip temperature sensor 38 does not obstruct a flow of air, resulting in such an advantage that even if the on-chip temperature sensor 38 is disposed upstream of the diaphragm 19, the flow of air is hardly obstructed.

The position at which the on-chip temperature sensor 38 measures the temperature of the tributary 3 is not limited to the upstream side of the diaphragm 19 in the main flow direction of the tributary 3. For example, the on-chip temperature sensor 38 may be disposed on the sensor element 15, and at a position displaced in the lateral direction of the diaphragm 19 with respect to the main flow direction of the tributary 3.

In the flow rate measuring device according to the fourth embodiment, because the temperature of the tributary 3 is measured by the on-chip temperature sensor 38 disposed in the sensor element 15, components such as the support member 57 or a thermistor element configuring the second temperature sensor 37 can be reduced. Also, because the temperature measuring resistor 35 is formed on the sub-diaphragm 20, a response of the temperature measuring resistor 35 can be made quicker than that of an axial lead type or chip type thermistor, and a correction error due to the response delay can be reduced.

As a modified example of the third embodiment, the on-chip temperature sensor 38 described in the fourth embodiment may be disposed on the sensor element 15 installed within the second sub-passage 12b. As a result, a breakage rate of the on-chip temperature sensor 38 due to collision of the foreign matter 58 can be improved, and a heat capacity of the on-chip temperature sensor 38 is very small. For that reason, even within the second sub-passage 12b in which only a slight fluid flows because of multiple branch of the passage, the temperature of the fluid can be measured with a fast response and high precision.

Figure 9:
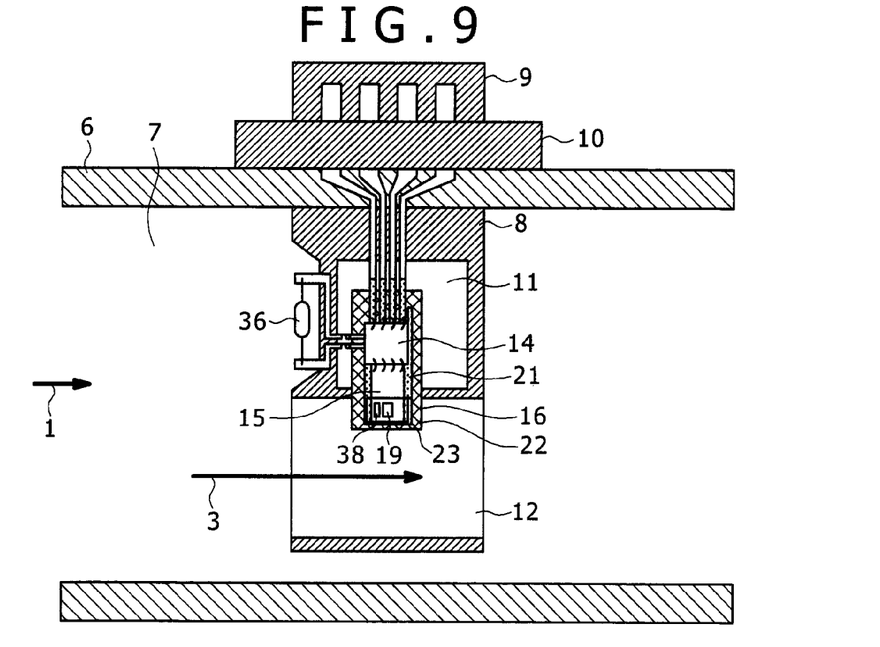
FIG. 9 is a configuration diagram of a flow rate measuring device according to a fifth embodiment.

Subsequently, a fifth embodiment according to the technique of the present invention will be described with reference to FIG. 9.

In a flow rate measuring device according to the fifth embodiment, the circuit element 14 and the sensor element 15 in the flow rate measuring device according to the fourth embodiment are mounted on a lead frame 21, and a sensor module 22 is molded with a mold resin 16. The circuit element 14 conducts an electric connection with the first temperature sensor 36 and signal transmission to the external through a protrusion of the lead frame 21 which is protruded from the sensor module 22. Also, the sensor module 22 includes a mold opening portion 23 so that the diaphragm 19 and the sub-diaphragm 20 of the sensor element 15 are exposed to the tributary 3.

In the flow rate measuring device according to the fifth embodiment, because the sensor module 22 is formed by molding, an assembling precision is improved more than that of the assembling method using substrate adhesion. For that reason, a reduction in a yield caused by the assembling precision during manufacturing can be suppressed as compared with the flow rate measuring device of the fourth embodiment. Also, the mold resin 16 is frequently more inexpensive than the substrate 13, and the cost suppression is effective.

Figure 10:
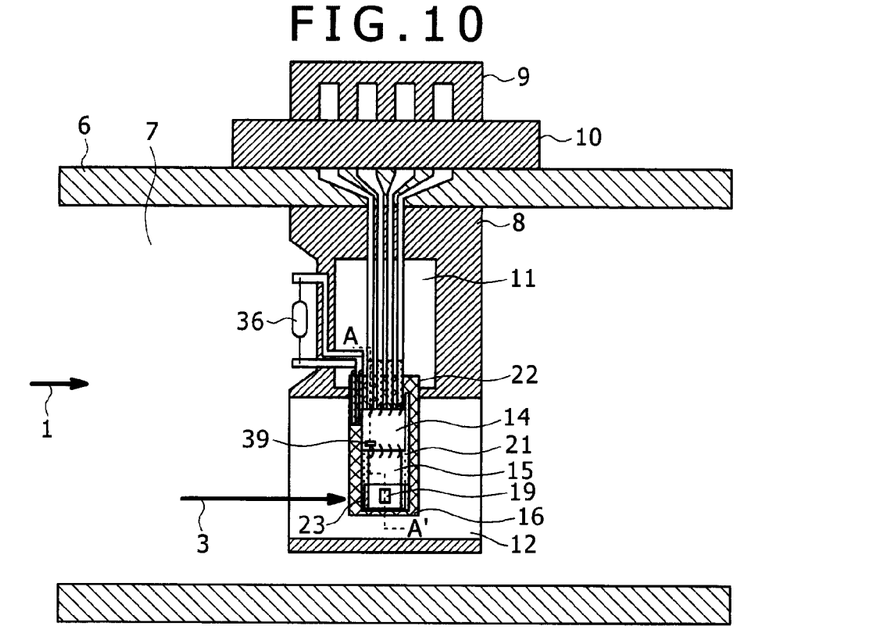
FIG. 10 is a configuration diagram of a flow rate measuring device according to a sixth embodiment.
Figure 11:
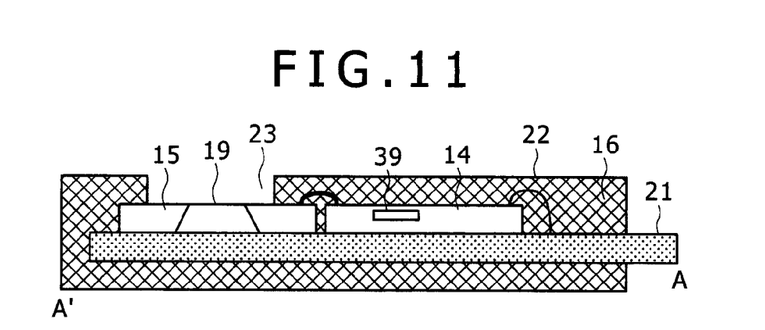
FIG. 11 is a cross-sectional view of the flow rate measuring device taken along a line A-A' according to the sixth embodiment.

Subsequently, a sixth embodiment according to the technique of the present invention will be described with reference to FIGS. 10 and 11.

A flow rate measuring device according to the sixth embodiment is characterized in that the second temperature sensor 37 in the flow rate measuring device according to the first embodiment is replaced with a temperature sensor 39 with a built-in circuit which is formed on the circuit element 14. Also, the circuit element 14 and the sensor element 15 are mounted on the lead frame 21, and the sensor module 22 is also molded with the mold resin 16. The circuit element 14 conducts the electric connection with the first temperature sensor 36 and signal transmission to the external through the protrusion of the lead frame 21 which is protruded from the sensor module 22. Also, the sensor module 22 includes the mold opening portion 23 so that the diaphragm 19 and the sub-diaphragm 20 of the sensor element 15 are exposed to the tributary 3.

In the flow rate measuring device according to the sixth embodiment, the temperature sensor 39 with a built-in circuit is disposed within the circuit element 14, resulting in such an advantage that there occurs no breakage mode such as breakage or characteristic change of the on-chip temperature sensor 38 due to the collision or attachment of foreign matter. Therefore, an environmental reliability and a long-period reliability of the flow rate measuring device can be improved.

In the flow rate measuring device according to the sixth embodiment, the sensor module 22 is arranged so that the surface of the sensor module 22 around the temperature sensor 39 with a built-in circuit is exposed to the tributary 3, as a result of which the temperature sensor 39 with a built-in circuit is likely to follow the temperature of the tributary 3.

Figure 12:
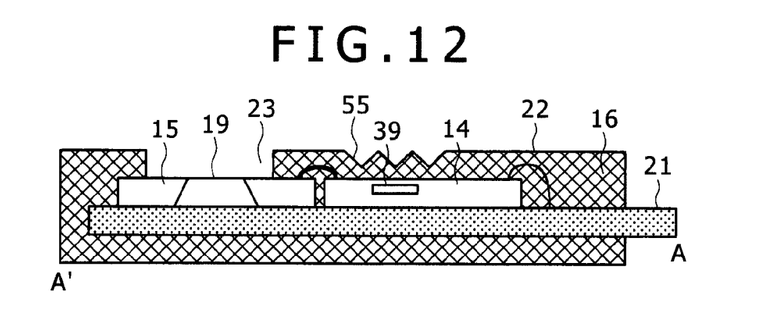
FIG. 12 is a cross-sectional view of a flow rate measuring device taken along a line A-A' according to a modified example of the sixth embodiment.

Subsequently, a modified example of the sensor module 22 in which the temperature sensor 39 with a built-in circuit is further likely to follow the temperature of the tributary 3 will be described with reference to FIG. 12.

The modified example of the flow rate measuring device according to the sixth embodiment is characterized in that an irregular portion 55 is disposed on the surface of the sensor module 22 around a portion in which the temperature sensor 39 with a built-in circuit is arranged.

With the provision of the irregular portion 55, because a surface area of the sensor module 22 is enlarged, the amount of heat exchange with the tributary 3 is increased, and the temperature sensor 39 with a built-in circuit can further follow the temperature of the tributary 3 at a high speed.

With the provision of the irregular portion 55, because the surface area of the sensor module 22 is enlarged, the amount of heat exchange with the tributary 3 is increased, the temperature sensor 39 with a built-in circuit can further follow the temperature of the tributary 3 at a high speed, and a temperature distribution within the sensor module 22 can be more uniformized.

Also, as described in the fifth embodiment and the sixth embodiment, in the flow rate measuring device having a resin mold mounting structure, the same advantages can be obtained in a circuit where the circuit element 14 and the sensor element 15 are combined together, and in a sensor module where sensor composite elements are molded. When the circuit and the sensor composite elements are used, a temperature sensitive resistor formed on the sub-diaphragm may be used, or a temperature sensor incorporated into the circuit portion may be used as a method of measuring the temperature of the tributary 3.

Figure 13:
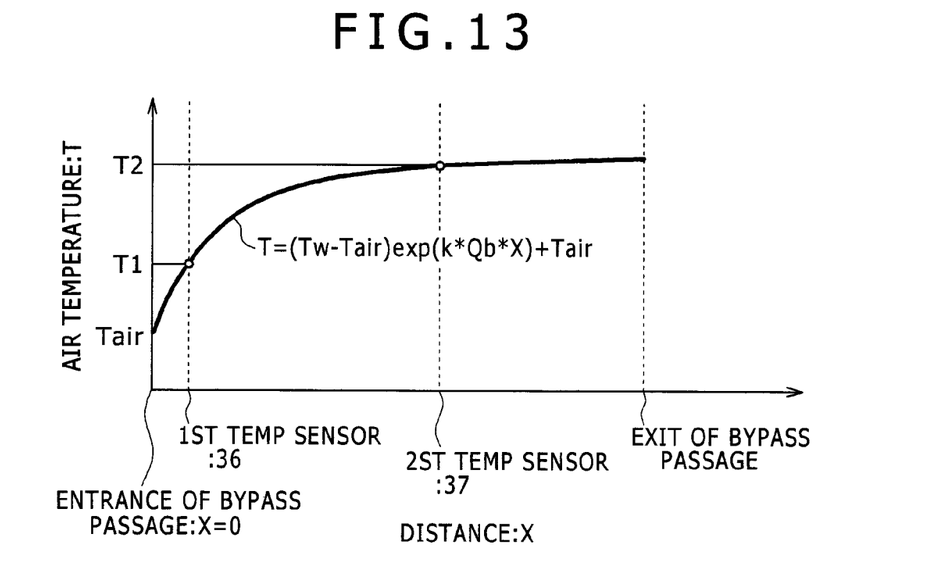
FIG. 13 is a temperature distribution diagram of a fluid flowing in a sub-passage 12.

Subsequently, a method of measuring the temperature of the intake air 1 in the flow rate measuring device according to a seventh embodiment will be described with reference to FIG. 13.

In the flow rate measuring device according to the first embodiment, the first temperature sensor 36 is supported with the use of the support member 56 protruded from a wall surface of the casing 8 toward the main passage 7, and the temperature of the intake air 1 is directly measured by the first temperature sensor 36.

As the temperature measuring method of the intake air 1 different from the above method, the flow rate measuring device according to the seventh embodiment employs a method in which the first temperature sensor 36 and the second temperature sensor 37 are arranged at different positions within the sub-passage 12, a temperature change quantity of the tributary 3 within the sub-passage 12 is acquired, and a temperature of the intake air 1 is derived from the temperature change quantity through an arithmetic calculation.

A temperature distribution model of the tributary 3 flowing within the sub-passage 12 is expressed by Expression 3. T is a temperature of the tributary 3 at a temperature observation point, Tw is a termination temperature of the tributary 3 within the sub-passage 12, Tair is a temperature of the intake air 1, k is an adjustment constant, Qb is a flow rate of the tributary 3, and X is a distance from an entrance of the sub-passage 12 to the temperature observation point. Also, the adjustment constant k is an adjustment parameter for adjusting a virtual temperature distribution model to a realistic temperature distribution obtained from experimental values.

[Ex. 3]

$$T(X)=(Tw-Tair)\exp(k*Qb*X)+Tair \qquad \text{Ex. 3}$$

Subsequently, instead of temperature information St1 obtained from the first temperature sensor 36 arranged within the sub-passage 12, temperature information St2 obtained by the second temperature sensor 37, lengths of the first temperature sensor 36 and the second temperature sensor 37 from an entrance of the sub-passage 12, and a flow rate Qb of the tributary 3, a numerical value based on a digital signal s4 is assigned to Expression 3, and simultaneous equations of Expressions 4 and 5 are prepared.

[Ex. 4]

$$T1=(Tw-Tair)\exp(k*f(s4)*X1)+Tair \qquad \text{Ex. 4}$$

[Ex. 5]

$$T2=(Tw-Tair)\exp(k*f(s4)*X2)+Tair \qquad \text{Ex. 5}$$

In those expressions, since values other than Tair and Tw are known, the simultaneous equations are solved to obtain Tair and Tw.

In this embodiment, the digital signal s4 is used instead of Qb. As described above, s4 is a signal including a measurement error caused by a difference between the fluid temperature within the main passage 7 and the fluid temperature within the sub-passage 12, and a measurement error caused by a change in the environmental temperature under a circumstance where the fluid temperature within the main passage 7 and the fluid temperature within the sub-passage 12 are equal to each other. Therefore, an error may occur in Tair and Tw, but the error can be suppressed by arranging the first temperature sensor 36 and the second temperature sensor 37 at positions where a distance X1 between the first temperature sensor 36 and an entrance of the sub-passage 12 is brought closer to zero as much as possible, and a distance X2 between the second temperature sensor 37 and the entrance of the sub-passage 12 is as large as possible.

In the flow rate measuring device according to the seventh embodiment, because the first temperature sensor 36 may not be disposed outside of the casing 8, a defect such as damage or deformation caused by bringing the first temperature sensor 36 and the support member 56 disposed outside of the casing 8 into contact with the pipe 6 when the casing 8 is inserted into the pipe 6 can be suppressed.

Figure 14:
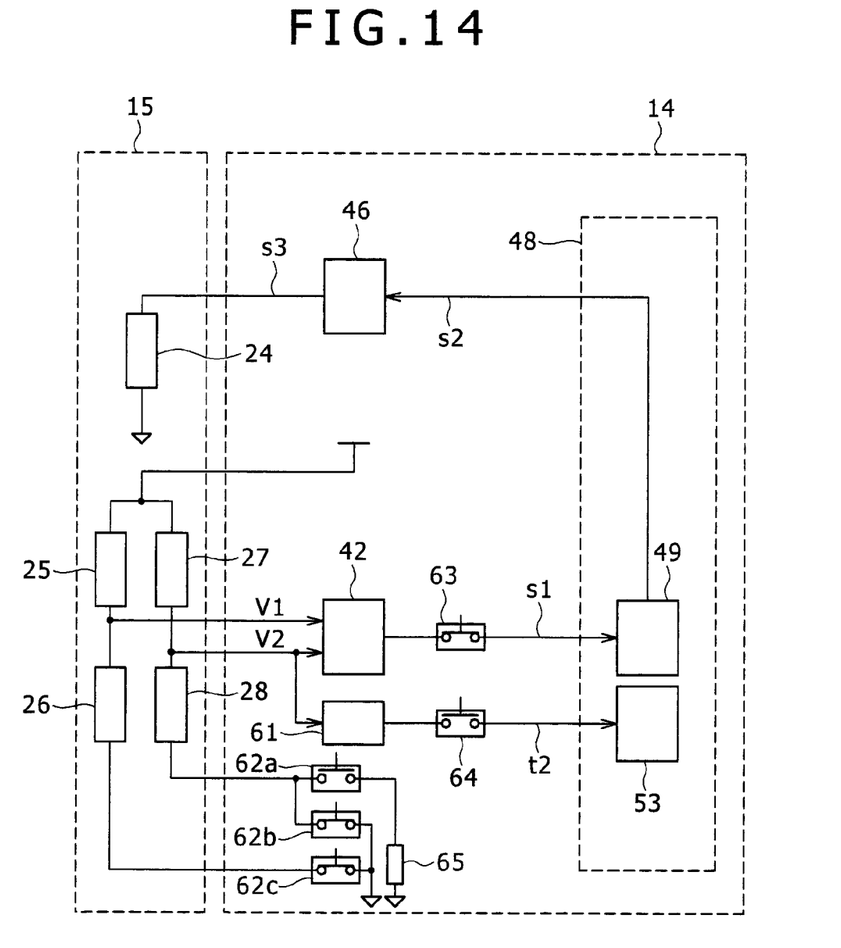
FIG. 14 is a circuit diagram of a flow rate measuring device according to an eighth embodiment.

Subsequently, a method of measuring the fluid temperature within the sub-passage 12 of the flow rate measuring device according to an eighth embodiment will be described with reference to FIG. 14.

In the flow rate measuring device according to the eighth embodiment, in a heater temperature control circuit of the flow rate measuring device according to the first embodiment, a switch element 63 is disposed on a transmission path for transmitting an output of the AD converter 42 to the heater temperature control program 49. Also, an AD converter 61 that receives an intermediate potential V2 between the reference resistor 27 and the reference resistor 28 is disposed. An output of the AD converter 61 is transmitted to the correction amount derivation program 53 through a switch element 64. Respective terminals of the reference resistor 26 and the reference resistor 28, which are not input to the AD converter 42, are guided into the circuit element 14. Switch elements 62a to 62c that control connection states between the respective terminals of the reference resistor 26 and the reference resistor 28, and a ground potential within the circuit element 14, and a fixed resistor 65 formed within the circuit element 14 are disposed. The fixed resistor 65 is interposed between the switch element 62a and the ground potential.

The above switch elements 62 to 64 conduct switching operation in synchronization with each other. Specifically, for example, when the switch element 62a is opened, the switch element 62b, the switch element 62c, and the switch element 63 are closed, and the switch element 64 is opened. On the other hand, when the switch element 62a is closed, the switch element 62b, the switch element 62c, and the switch element 63 are opened, and the switch element 64 is closed.

In this example, because resistance values of the reference resistor 27 and the reference resistor 28 are changed according to a temperature of the tributary 3, if the switch element 62a and the switch element 64 are closed, and the switch element 62b, the switch element 62c, and the switch element 63 are opened, the intermediate potential V2 is based on the temperature of the tributary 3. Therefore, an output t2 of the AD converter 61 in the above state is a temperature signal based on the temperature of the tributary 3.

On the other hand, if the switch element 62a and switch element 64 are opened, and the switch element 62b, the switch element 62c, and the switch element 63 are closed, the same circuit as the heater temperature control circuit in the first embodiment is configured. Therefore, heater temperature control operation can be conducted.

Preferably, a switching control cycle of the switch elements 62 to 64 is set to such a cycle that the switch element 62a and the switch element 64 are opened, and the switch element 62b, the switch element 62c, and the switch element 63 are closed, for example, at timing when the heater temperature control program 49 reads the digital signal s1. The switching control of the switch elements 62 to 64 is conducted at the above timing, thereby being capable of preventing the malfunction of the heater temperature control.

The flow rate measuring device according to the eighth embodiment can realize only a simple change of the existing heater temperature control circuit, and can realize the temperature measurement of the tributary 3 without any increase in the number of components and addition of processes.

Figure 15:
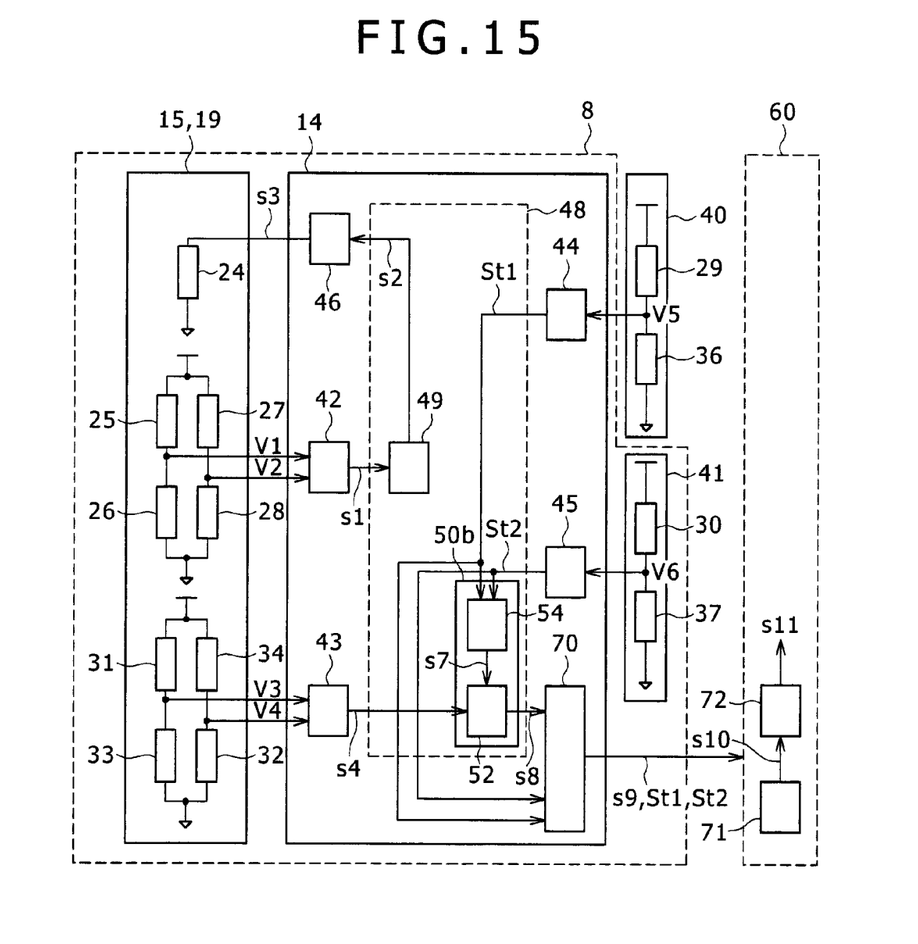
FIG. 15 is a functional block configuration of a flow rate measuring device according to a ninth embodiment.

Subsequently, a flow rate measuring device according to a ninth embodiment will be described with reference to FIG. 15.

According to the flow rate measuring device according to the ninth embodiment, the temperature difference causing error correction unit 50a and the DA converter 47 disposed in the circuit element 14 is replaced with a communication driver 70, and a correction amount derivation unit 71 and a flow rate signal correction unit 72 are disposed in the ECU 60, in the flow rate measuring device according to the first embodiment.

The communication driver 70 outputs the flow rate signal s9, and the digital temperature signals St1, St2 to the ECU 60 as digital signals. In this example, because the circuit element 14 in the flow rate measuring device according to the ninth embodiment has no function for correcting the temperature error causing error, the flow rate signal s9 includes the temperature difference causing error.

On the other hand, the ECU 60 inputs the flow rate signal s9 and the digital temperature signals St1, St2 to a correction amount derivation unit 71, and derives a correction amount s10 for correcting the temperature difference causing error included in the output signal s9. Then, the flow rate signal correction unit 72 corrects the flow rate signal s9 on the basis of the above correction amount s10, and outputs a flow rate signal s11 including no temperature difference causing error.

That is, the correction amount derivation unit 71 corresponds to the correction amount derivation program 53 in the first embodiment, and the flow rate signal correction unit 72 corresponds to the correction program 51. Therefore, as a modified example of the ninth embodiment, the correction amount derivation program 53 is disposed on the circuit element 14 side to derive the correction amount s5, and the correction amount s5 is transmitted to the ECU 60 together with the flow rate signal s9. In addition, the flow rate signal correction unit 72 is disposed at the ECU 60 side, and the transmitted correction amount s5 and flow rate signal s9 may be corrected.

Also, in addition to a function for correcting the temperature difference causing error, a function for correcting the absolute temperature causing error may be provided in the ECU 60. In this case, likewise, the correction amount derivation unit and the correction unit may be disposed in the ECU 60, or only any one of those units may be disposed in the ECU 60.

The signal transmission medium to the ECU 60 is not particularly limited. For example, the communication driver may be replaced with a DA converter, and an output method using an analog signal as the transmission medium may be applied. Also, the communication driver 70 may be replaced with a variable frequency oscillator, and an output method using a frequency signal as the transmission medium may be applied. Further, the communication driver 70 may be replaced with a modulator, and an output method using a modulated signal as the transmission medium may be applied.

Also, as means for transmitting information on the temperature T1 of the intake air 1 and the temperature T2 of the tributary 3 to the ECU 60, the intermediate potential V5 between the first temperature sensor 36 and the fixed resistor 29, and the intermediate potential V6 between the second temperature sensor 37 and the fixed resistor 30 may be directly output to the ECU 60.

The advantage of the flow rate measuring device according to the above-mentioned ninth embodiment resides in that the technique of the present invention can be utilized without any change in the circuit element 14 if necessary functions of the correction programs 51, 52, and the correction amount derivation programs 53, 54 are added to the ECU 60.

LIST OF REFERENCE SIGNS

1 intake air
2 mainstream 3 tributary
4 sub-tributary
5 unused
6 pipe
7 main passage
8 casing
9 connector portion
10 flange portion
11 circuit chamber
12 sub-passage
13 substrate
14 circuit element
15 sensor element
16 mold resin
17, 18 unused
19 diaphragm
20 sub-diaphragm
21 lead frame
22 sensor module
23 mold opening portion
24 heater resistor
25 heater temperature monitor resistor
26 to 28 reference resistors
29, 30, 65 fixed resistors
31, 32 upstream temperature measuring resistors
33, 34 downstream temperature measuring resistors
35 temperature measuring resistors
36 first temperature sensor
37 second temperature sensor
38 on-chip temperature sensor
39 temperature sensor with built-in circuit
40, 41 series resistor circuits
42 to 45, 61 AD converters
46, 47 DA converters
48 digital signal processor circuit (DSP)
49 heater temperature control program
50 conversion program
51, 52 correction programs
53, 54 correction amount derivation programs
55 irregular portion
56, 57 support members
58 foreign matter
59 area
60 engine control unit (ECU)
62 to 64 switch elements
70 communication driver
71 correction amount derivation unit
72 flow rate signal correction unit

The invention claimed is:

1. A flow rate measuring device comprising:
a sub-passage that takes a part of the fluid flowing in a main passage;
a sensor element that is disposed within the sub-passage;
a first temperature sensor that measures a temperature of the fluid flowing in the main passage;
a second temperature sensor that is disposed within the sub-passage; and
measuring means for measuring a flow rate of the fluid flowing in the main passage on the basis of an output of the first temperature sensor, an output of the second temperature sensor, and an output of the sensor element.

2. The flow rate measuring device according to claim 1, further comprising:
a correction circuit that corrects an output of the sensor element on the basis of an output of the first temperature sensor and an output of the second temperature sensor.

3. The flow rate measuring device according to claim 2, wherein the correction circuit includes:
deriving means for deriving a correction value based on a flow rate ratio of the main passage and the sub-passage on the basis of an output of the first temperature sensor and an output of the second temperature sensor; and
converting means for converting the output of the sensor element into the flow rate of the fluid flowing into the main passage on the basis of the correction value.

4. The flow rate measuring device according to claim 1, wherein the sensor element includes a diaphragm formed on a semiconductor substrate, a heat generation resistor formed on the diaphragm, and temperature measuring resistors disposed upstream and downstream of the heat generation resistor in a flow of the fluid.

5. The flow rate measuring device according to claim 4, wherein a sub-diaphragm is disposed on the semiconductor substrate, and
wherein the second temperature sensor is disposed on the sub-diaphragm.

6. The flow rate measuring device according to claim 5, wherein the sensor element and the correction circuit are mounted on a lead frame,
wherein a sensor module in which the sensor element, the correction circuit, and the lead frame are integrally sealed by mold is formed,
wherein the sensor module has a mold opening portion so that the diaphragm is exposed to the fluid.

7. The flow rate measuring device according to claim 4, wherein the sensor element and a correction circuit are mounted on a lead frame,
wherein a sensor module is formed by integrally sealing the sensor element, the correction circuit, and the lead frame in resin, and
wherein the sensor module has a mold opening portion so that the diaphragm is exposed to the fluid.

8. The flow rate measuring device according to claim 7, wherein the second temperature sensor is disposed within the sensor module, and an irregular portion is disposed on the sensor module surface.

9. The flow rate measuring device according to claim 8, wherein a sensor module surface of a portion on which the second temperature sensor is disposed is roughened.

10. The flow rate measuring device according to claim 4, wherein the sub-passage has a bend, and the sensor element is disposed downstream of the bend in a flow of the fluid.

11. The flow rate measuring device according to claim 10, wherein the second temperature sensor is located in the vicinity of the sensor element.

12. The flow rate measuring device according to claim 4, wherein the sub-passage includes a first sub-passage having two or more opening portions that communicate with the main passage, and a second sub-passage having one or more opening portions that communicate with the first sub-passage, and the sensor element is disposed within the second sub-passage.

13. The flow rate measuring device according to claim 12, wherein the one or more opening portions of the second sub-passage have an angle of 90 degrees or more to a main flow direction of the fluid flowing in the first sub-passage.

14. The flow rate measuring device according to claim 1, wherein the first temperature sensor is arranged to be exposed to the fluid flowing in the main passage, and wherein the second temperature sensor is arranged to be exposed to the fluid flowing in the sub-passage.

15. The flow rate measuring device according to claim 1, wherein the first temperature sensor is arranged upstream of the second temperature sensor in the flow of the fluid.

16. A flow rate measuring device comprising:
a sub-passage that takes a part of the fluid flowing in a main passage;
a sensor element that is disposed within the sub-passage;
a first temperature sensor that measures a temperature of the fluid flowing in the main passage;
a second temperature sensor that is disposed within the sub-passage; and
measuring means for measuring a flow rate of the fluid flowing in the main passage on the basis of an output of the first temperature sensor, an output of the second temperature sensor, and an output of the sensor element, wherein
an air flow rate is measured on the basis of temperature information measured by the first temperature sensor and the second temperature sensor.

* * * * *